United States Patent [19]

Konishi

[11] Patent Number: 4,494,020
[45] Date of Patent: Jan. 15, 1985

[54] HIGH SENSITIVITY SENSE AMPLIFIER USING DIFFERENT THRESHOLD VALUED MOS DEVICES

[75] Inventor: Satoshi Konishi, Tokyo, Japan

[73] Assignee: Tokyo Shibaura Denki Kabushiki Kaisha, Kawasaki, Japan

[21] Appl. No.: 484,468

[22] Filed: Apr. 13, 1983

[51] Int. Cl.³ ................... H03K 5/24; G01R 19/165; G11C 7/06
[52] U.S. Cl. .................... 307/530; 307/450; 365/208
[58] Field of Search ............... 307/355, 362, 530, 450; 365/190, 196, 205, 207–208

[56] References Cited

U.S. PATENT DOCUMENTS

| | | | |
|---|---|---|---|
| 3,685,025 | 8/1972 | Bryant et al. | 365/207 |
| 3,838,295 | 9/1974 | Lindell | 307/530 X |
| 3,983,412 | 9/1976 | Roberts et al. | 307/530 |
| 4,027,176 | 5/1977 | Heuber et al. | 307/530 |
| 4,136,292 | 1/1979 | Suzuki et al. | 307/355 |
| 4,144,590 | 3/1979 | Kitagawa | 365/205 |

OTHER PUBLICATIONS

Chin et al., "Low-Power Data Register"; *IBM Tech. Discl. Bull.*; vol. 15, No. 12, pp. 3891–3892; 5/73.
Chu et al., "Low-Power High-Speed Sense Latch"; *IBM Tech. Discl. Bull.*; vol. 17, No. 9, pp. 2582–2583; 2/75.

Primary Examiner—Larry N. Anagnos
Attorney, Agent, or Firm—Schwartz, Jeffery, Schwaab, Mack, Blumenthal & Koch

[57] ABSTRACT

A sense amplifier wherein each of a first through a fourth inverter comprises a driving transistor and a load transistor; the first, second, third and fourth inverters are interconnected in such a way that the outputs of the first and second inverters are applied to the third and fourth inverters, respectively; the first and second inverters have input terminals while the third and fourth inverters have output terminals; one terminal of each of the first through fourth inverters is connected to first power supply while the other terminals of the first and second inverters are connected directly or through a control transistor to second power supply; and the outputs from the first and second inverters are applied to the other terminals of third and fourth inverter, respectively.

5 Claims, 34 Drawing Figures

HIGH SENSITIVITY SENSE AMPLIFIER USING DIFFERENT THRESHOLD VALUED MOS DEVICES

BACKGROUND OF THE INVENTION

The present invention relates to a sense amplifier for sensing a small voltage difference between two input signals and amplifying it to a high or low logic voltage level.

The conventional sense amplifier generally comprises four or five transistors. It is however extremely difficult with these transistors to design and construct a sense amplifier with a satisfactorily high degree of sensitivity.

Many attempts have been made to improve the sensitivity of the sense amplifiers by improving the input-output characteristics of transistors, but it is very difficult to match the input-output characteristics of high gain amplifier with input voltage levels. As a result, it is difficult to attain a high degree of sensitivity.

SUMMARY OF THE INVENTION

The present invention was made to overcome the above and other problems encountered in the conventional sense amplifiers and has for its object to provide a sense amplifier with a higher degree of sensitivity.

To the above and other ends, the present invention provides a sense amplifier comprising a first inverter comprising a series circuit of a first transistor which is a driving transistor and which has a first input terminal and a second transistor which is a load transistor; a second inverter comprising a series circuit of a third transistor which is a driving transistor and which has a second input terminal and a fourth transistor which is a load transistor; a third inverter comprising a series circuit of a fifth transistor which is a driving transistor and to which is applied the output of said second inverter and a sixth transistor which is a load transistor, the junction between said fifth and sixth transistor being a first output terminal; a fourth inverter comprising a series circuit of a seventh transistor which is a driving transistor and to which is applied the output of said first inverter and an eighth transistor which is a load transistor; the junction between said seventh and eighth transistors being a second output terminal; each of the load transistors in said first, second, third and fourth inverters having a terminal connected to a first power supply; each of said first and third transistors or driving transistors of said first and second inverters having a terminal connected to a second power supply; said fifth transistor or driving transistor of said third inverter having a terminal to which is applied as a power supply the output of said first inverter while said seventh transistor or driving transistor of said fourth inverter having a terminal to which is applied as a power supply the output of said second inverter; said first and third transistors having a first threshold voltage, said second and fourth transistors having a second threshold voltage, said fifth and seventh transistors having a third threshold voltage and said sixth and eighth transistors having a fourth threshold voltage; and external input signals being applied to said first and second input terminals, whereby output signals can be derived from said first and second output terminals.

In addition to the above circuit construction of sense amplifier, the present invention provides the other sense amplifier which is analogous to the above circuit, comprising, instead of the connection to the second power supply in the first and third transistors in the above circuit construction, each of said first and third transistors or driving transistors of said first and second inverters having a common terminal connected to the second power supply through a ninth transistor controlled by another external signal.

BRIEF DESCRIPTION OF THE DRAWINGS

Same reference characters and numerals are used to designate similar parts throughout the figures.

DETAILED DESCRIPTION OF THE INVENTION

Prior to the description of the preferred embodiments of the present invention with reference to FIGS. 2 through 14, the conventional sense amplifiers will be briefly described with reference to FIGS. 1(a) through (d) so as to more distinctly point out the problems encountered in the conventional sense amplifier.

Figure 1A:
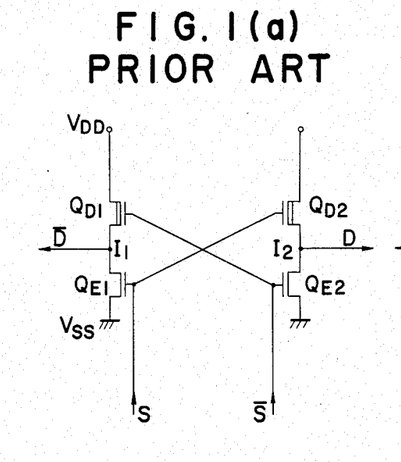
FIGS. 1(a) and (b) are circuit diagrams of the prior art sense amplifiers, respectively.
Figure 1B:
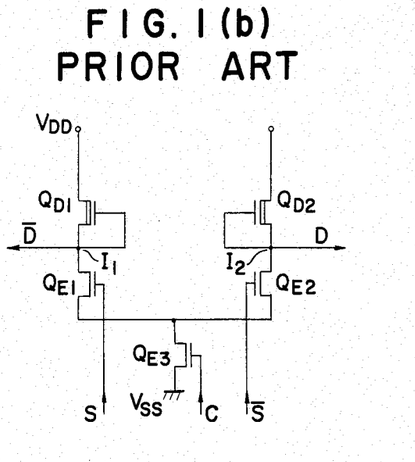
Figure 1C:
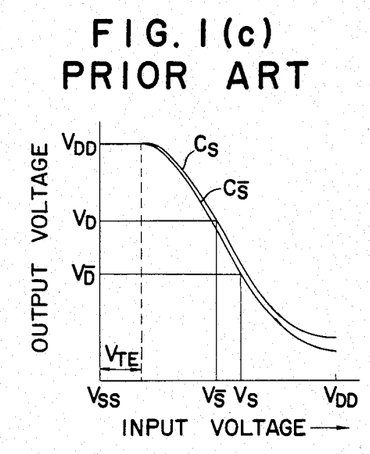
FIGS. 1(c) and (d) show the input-output characteristics of the sense amplifier as shown in FIG. 1(a)

In FIGS. 1(a) and (b) are shown the prior art sense amplifiers. Transistors $Q_{E1}$ and $Q_{E2}$ are enhancement type MOS transistors while $Q_{D1}$ and $Q_{D2}$ are depletion type MOST transistors. The transistors $Q_{E1}$ and $Q_{E2}$ are used as driving transistors while the transistors $Q_{D1}$ and $Q_{D2}$ are used as load transistors, whereby E/D type inverters $I_1$ and $I_2$ are provided. Input signals S and $\overline{S}$ are applied to the gate terminals of the transistors $Q_{E1}$ and $Q_{E2}$, respectively and to the gate terminals, respectively, of the transistors $Q_{D2}$ and $Q_{D1}$. The sense amplification (or input-output characteristic curve) of this circuit is shown in FIG. 1(c). When the voltages $V_s$ and $\overline{V_s}$ are applied as the input signals $\overline{S}$ and S to the gate terminals of the load transistors $Q_{D1}$ and $Q_{D2}$, respectively, the output voltages $V_D$ and $\overline{V_D}$ are derived as indicated by the input-output characteristic curves $C_s$ and $C_{\bar{s}}$. That is, the sense amplification factor becomes $|V_D - \overline{V_D}|/|V_s - \overline{V_s}|$, which is nearly equal to the slope of the input-output characteristic curve of the E/D type inverters $I_1$ and $I_2$.

Figure 1D:
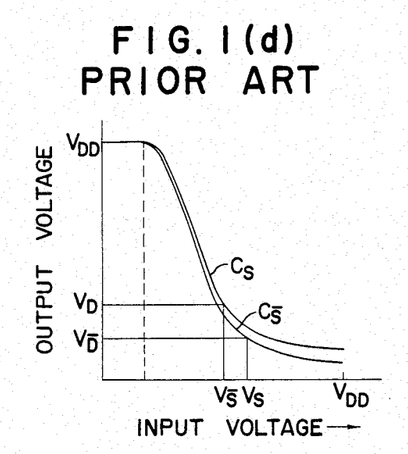

In order to increase the amplification factor, the magnitudes of conductance of the transistor $Q_{E1}$ and $Q_{E2}$ must be increased so that the slope of the input-output characteristic curves of the inverters $I_1$ and $I_2$ must be increased. However, if the slope of the input-output characteristic curve is increased, the range in the vicinity of the point in which the slope becomes maximum becomes narrow. Therefore, if the input voltage deviates from this range, the difference between the output voltages $|V_D - \overline{V_D}|$ is decreased as indicated in FIG.

1(d) so that there is a tendency that the amplification factor easily drops. Thus according to the prior art, the conductance of transistors $Q_{E1}$ and $Q_{E2}$ cannot be increased without limit so that it has been extremely difficult to increase the amplification factor. In FIG. 1(b), a control transistor $Q_{E3}$ is added to the sense amplifier shown in FIG. 1(a) so that the over-all operation of the sense amplifier may be controlled by the control signal C. Therefore, the sense amplifier as shown in FIG. 1(b) operates as the differential amplifiers. As is the case of the sense amplifier as shown in FIG. 1(a), it is difficult to increase the amplification factor in comparison with the sense amplifier as shown in FIG. 1(b).

Figure 2A:
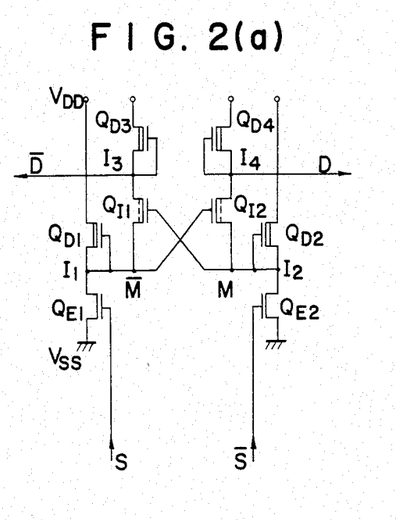
FIGS. 2(a) and (b) are circuit diagrams of a first and a second embodiments, respectively, of the present invention.

In FIG. 2(a) is shown a first embodiment of the present invention. The inverters $I_1$ and $I_2$ are of the E/D type which comprise the enhancement type driving transistors $Q_{E1}$ and $Q_{E2}$ the gate terminals of which are applied with the input signals S and $\overline{S}$ and depletion type load transistors $Q_{D1}$ and $Q_{D2}$. Inverters $I_3$ and $I_4$ comprise intrinsic type transistors $Q_{I1}$ and $Q_{I2}$ each having a threshold voltage in the vicinity of 0 V and depletion type load transistors $Q_{D3}$ and $Q_{D4}$. The outputs $\overline{M}$ and M from the inverters $I_1$ and $I_2$ are applied to the source terminals, respectively, of the driving transistors $Q_{I1}$ and $Q_{I2}$ of the inverters $I_3$ and $I_4$ and to the gate terminals, respectively, of the transistors $Q_{I2}$ and $I_{I1}$. The outputs $\overline{M}$ and M are also applied to the gate terminals, respectively, of the transistors $Q_{D1}$ and $Q_{D2}$ and the outputs $\overline{D}$ and D of the inverters $I_3$ and $I_4$ are applied to the gate terminals, respectively, of the transistors $Q_{D3}$ and $Q_{D4}$. The thresholds voltages of the transistors $Q_{E1}$ and $Q_{E2}$ are a small positive value (for instance, 0.8 V) while those of the transistors $Q_{D3}$ and $Q_{D4}$ are a relatively large negative value (for instance, −5.0 V). The threshold voltages of the transistors $Q_{I1}$ and $Q_{I2}$ are equal to or close to 0 V (for instance the voltage between about +0.1 V and about −0.1 V). These threshold values satisfy the following relationship:

$$|V_{TD}| > |V_{TE}| > |V_{TI}| \qquad (1)$$

Next, the mode of operation of the first embodiment will be described in more detail with reference to FIGS. 2(c) and (d). As indicated by the input-output characteristic curve $C_1$ in FIG. 2(c), in response to the input signals S and $\overline{S}$, the inverters $I_1$ and $I_2$ give the output voltages $V_M$ and $V_{\overline{M}}$. If the input signal S is little higher than the input signal $\overline{S}$, the output voltage $V_M$ is greater than $V_{\overline{M}}$ so that the transistor $Q_{I2}$ is disabled if the absolute value of the threshold voltage $V_{TI}$ is smaller than the difference between the output voltages $V_M$ and $V_{\overline{M}}$. As a result the output voltage D of the inverter $I_4$ consisting of the transistors $Q_{D4}$ and $Q_{I2}$; that is, the output voltage D of the sense amplifier becomes equal to a first reference voltage $V_{DD}$. Next, with reference to FIG. 2(c), the mode of operation of the inverter $I_3$ will be discussed. The voltage $V_{DD}$ of the first reference power supply is applied to the drain terminal of the transistor $Q_{D3}$ of the inverter $I_3$ and the output $\overline{M}$ of the inverter $I_1$ is applied to the source terminal of the transistor $Q_{I1}$. Therefore, the input-output characteristic curve becomes as indicated by $C_2$ and consequently the output of the inverter $I_3$; that is, the output $\overline{D}$ of the sense amplifier becomes $V_{\overline{D}}$ as indicated in FIG. 2(c). It follows therefore that the amplification factor of the sense amplifier becomes $|V_{DD}-V_D|/|V_s-V_s|$ which is clearly greater than the amplification factor $|V_D-V_D|/|V_s-V_s|$. If the threshold voltage of the transistor $Q_{I1}$ is negative, the input-output characteristic curve of the inverter $I_3$ becomes as indicated by $C_3$. The output voltage $V_D$ or output $\overline{D}$ is decreased so that the amplification factor is further increased. Moreover, the transistor $Q_{I2}$ can be disabled even though the threshold voltage $V_{TI}$ has a negative value as far as the condition $|V_M - V_{\overline{M}}| > |V_{TI}|$ is satisfied. Therefore, it is preferable that the threshold value $V_{TI}$ of the transistor $Q_{I1}$ has a small negative or positive value.

However, if the threshold value $V_{TI}$ exceeds the range between such relatively small positive and negative values; that is, if the transistors $Q_{I1}$ and $Q_{I2}$ are of the enhancement type, the difference between the output voltages $V_D$ and $V_{\overline{D}}$ is not so great if the difference between the input signals $|V_s - V_{\overline{s}}|$ is small. However, if the input signal voltage difference exceeds a certain value, the output voltage difference becomes greater than the conventional sense amplifier. Therefore the present invention may be advantageously applied to a sense amplifier having a high threshold voltage. In this case, Eq.(1) may be rewritten in the form of $$|V_{TD}| > |V_{TE}| \geqq |V_{TI}| \qquad (1')$$

Figure 2B:
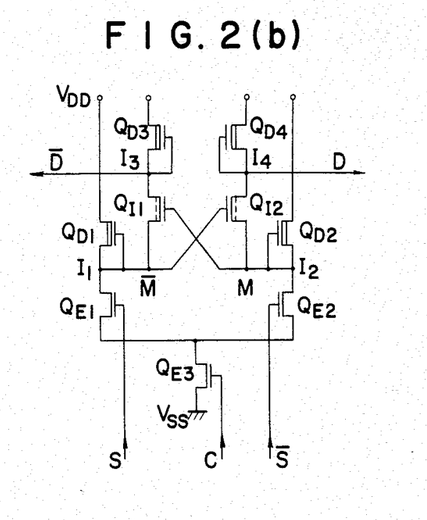
Figure 2C:
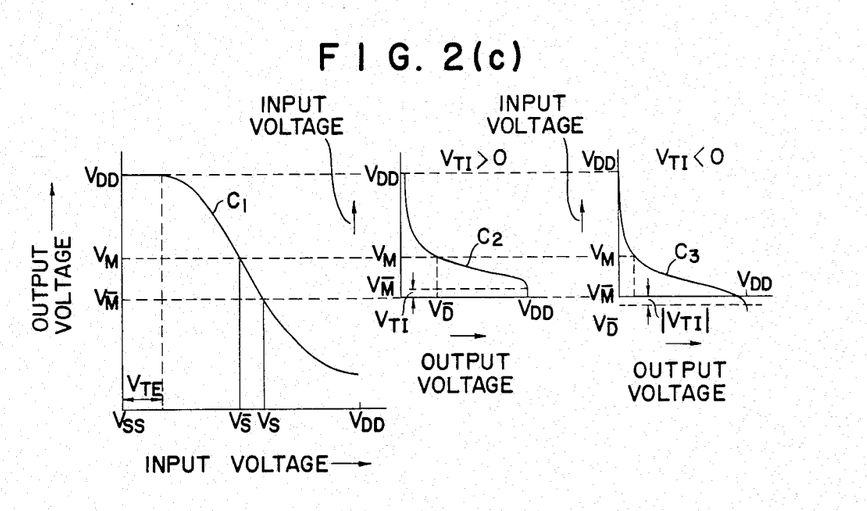
FIGS. 2(c) and (d) show the input-output characteristics of the sense amplifier as shown in FIG. 2(a)
Figure 2D:
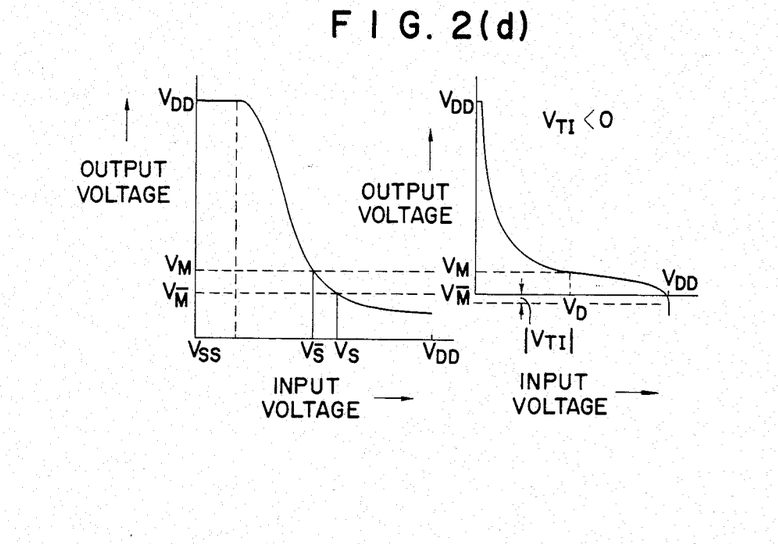
Figure 2E:
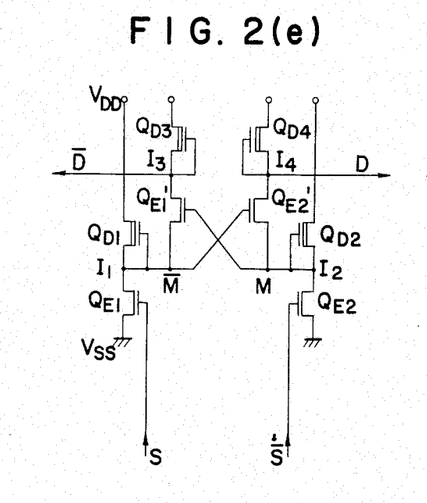
FIGS. 2(e) and (f) show variations, respectively, of the first and second embodiments as shown in FIGS. 2(a) and (b), respectively.

The sense amplifier as shown in FIG. 2(a) may be modified as shown in FIG. 2(e) so as to satisfy Eq.(1').

Furthermore, as shown in FIG. 2(d), even if the input voltages $V_s$ and $V_{\overline{s}}$ are deviated from an optimum range even though the amplification factors of the inverters $I_1$ and $I_2$ are increased, the transistor $Q_{I2}$ remains disabled as long as the difference $|V_M - V_{\overline{M}}|$ between the output M and $\overline{M}$ of the inverters $I_1$ and $I_2$ is higher than the absolute value $|V_{TI}|$ of the threshold voltage $V_{TI}$. Thus the sense amplifier can have a high amplification factor.

In FIG. 2(b) is shown a second embodiment of the present invention. A control transistor $Q_{E3}$ to which is applied the control signal C is added (to the first embodiment as shown in FIG. 2(a)). Therefore, the second embodiment can be controlled in response to the control signal C and is of the differential amplifier type and a high amplification factor can be attained.

Figure 2F:
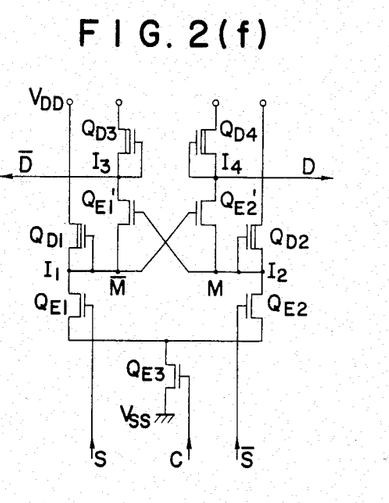

A modification of the second embodiment is shown in FIG. 2(f).

Next, some modifications of the first embodiment will be described with reference to FIG. 3 et sequentia. In a modification as shown in FIG. 3(a), the outputs $\overline{M}$ and M of the inverters $I_1$ and $I_2$ are applied to the gate terminals, respectively, of the load transistors $Q_{D3}$ and $Q_{D4}$ of the inverters $I_3$ and $I_4$.

Figure 4A:
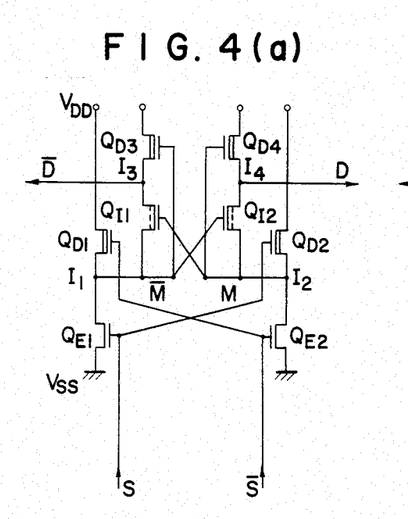
Figure 4B:
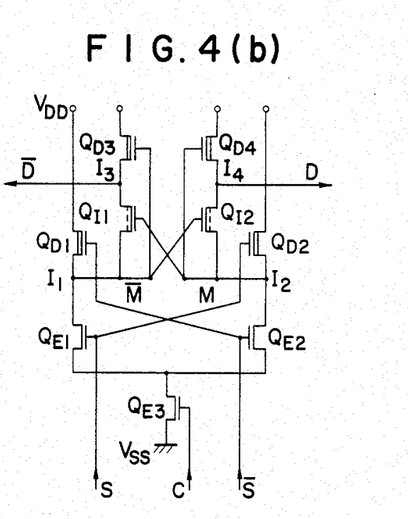

In another modification as shown in FIG. 4(a), the input signals $\overline{S}$ and S are further applied to the gate terminals, respectively, of the load transistors $Q_{D1}$ and $Q_{D2}$ of the inversters $I_1$ and $I_2$.

Figure 5A:
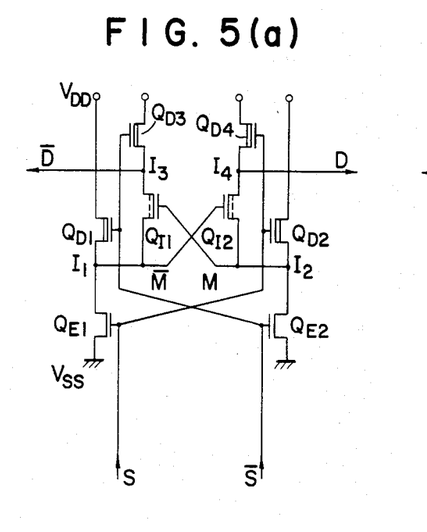
Figure 5B:
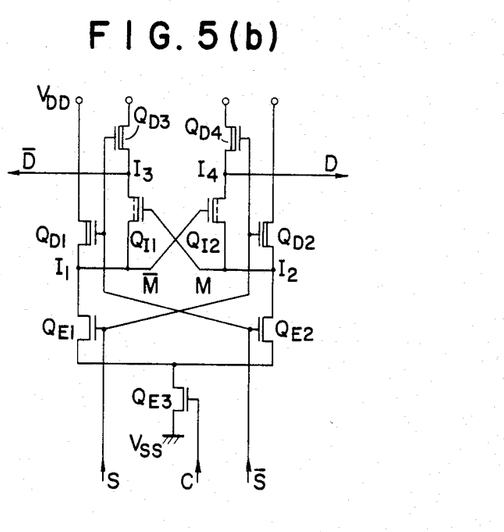

In a modification as shown in FIG. 5(a) of the circuit shown in FIG. 4(a), the input signals $\overline{S}$ and S are further applied to the gate terminals, respectively, of the load transistors $Q_{D3}$ and $Q_{D4}$ of the inverters $I_3$ and $I_4$.

Figure 3A:
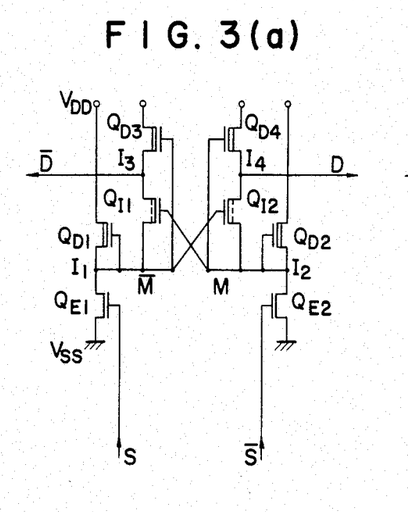
FIGS. 3(a) and (b), FIGS. 4(a) and (b), FIGS. 5(a) and (b), FIGS. 6(a) and (b), FIGS. 7(a) and (b), FIGS. 8(a) and (b), FIGS. 9(a) and (b), FIGS. 10(a) and (b), FIGS. 11(a) and (b), FIGS. 12(a) and (b), FIGS. 13(a) and (b) and FIGS. 14(a) and (b) show circuit diagrams of other embodiments of the present invention.
Figure 3B:
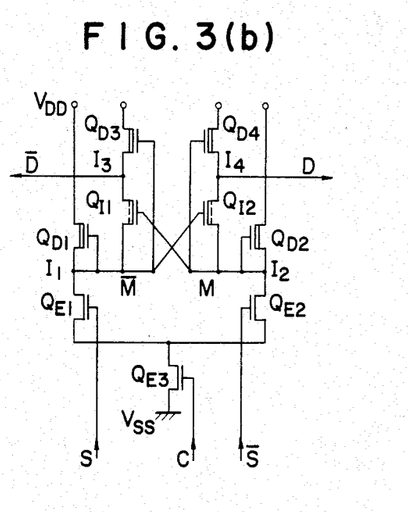
Figure 6A:
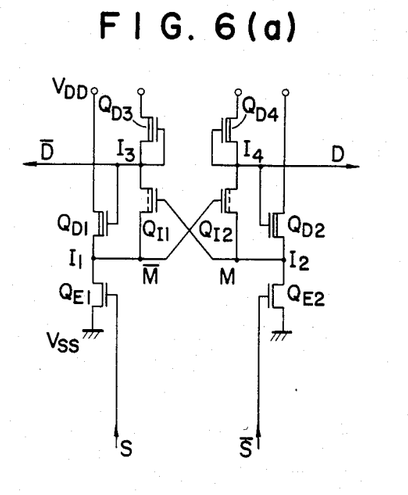
Figure 6B:
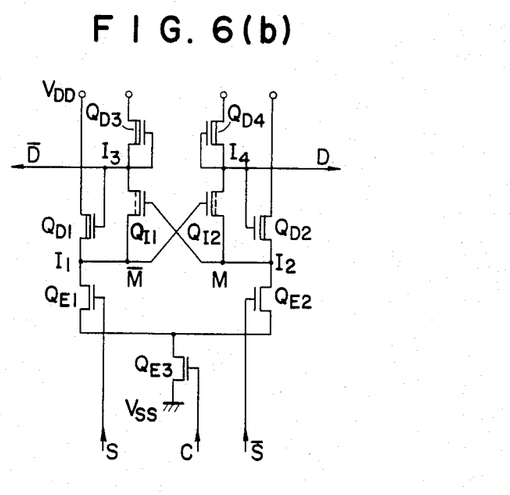
Figure 7A:
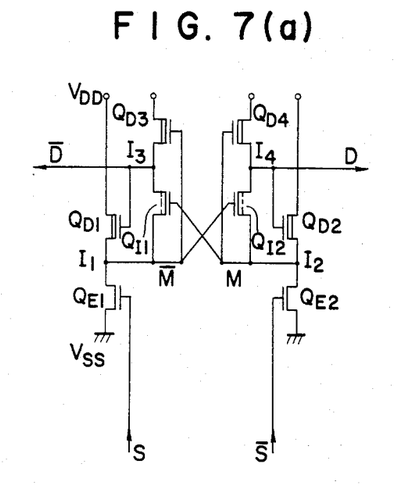
Figure 7B:
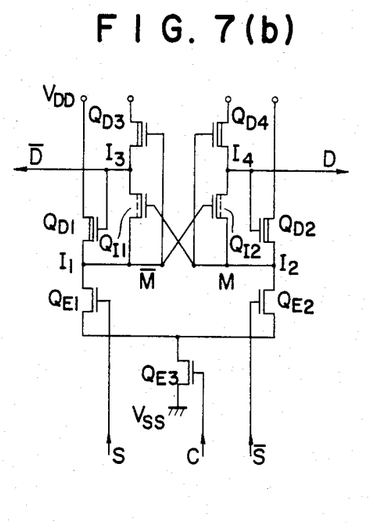
Figure 8A:
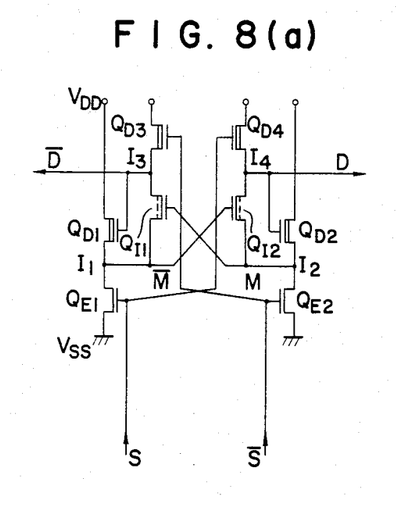
Figure 8B:
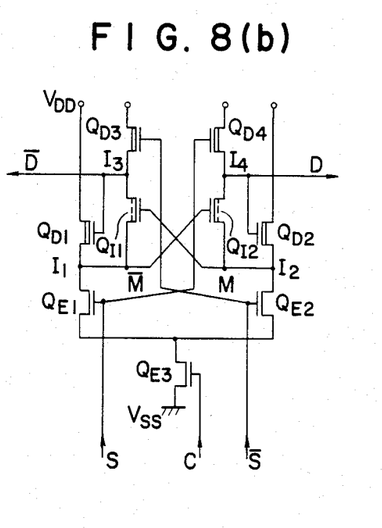

The circuits as shown in FIGS. 6(a), 7(a) and 8(a) correspond to those as shown in FIGS. 2(a), 3(a) and 5(a), respectively, and the outputs $\overline{D}$ and D are applied to the gate terminals of the load transistors $Q_{D1}$ and $Q_{D2}$, respectively so that the inverters $I_1$ and $I_2$ have positive feed back loops with the outputs and consequently a high amplification factor can be obtained.

Figure 9A:
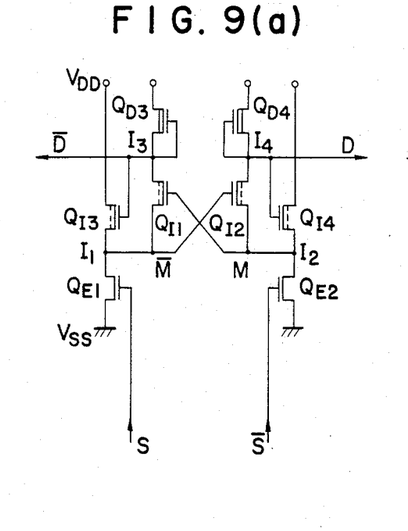
Figure 9B:
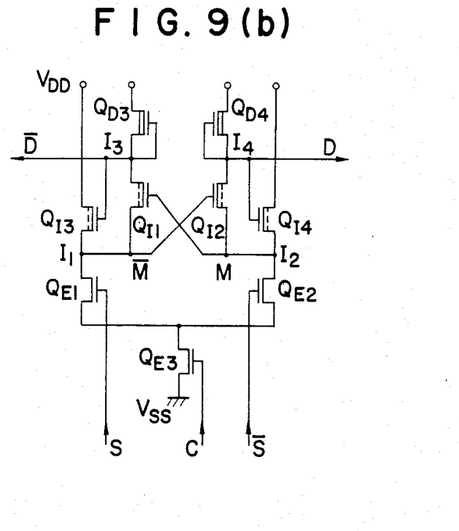
Figure 10A:
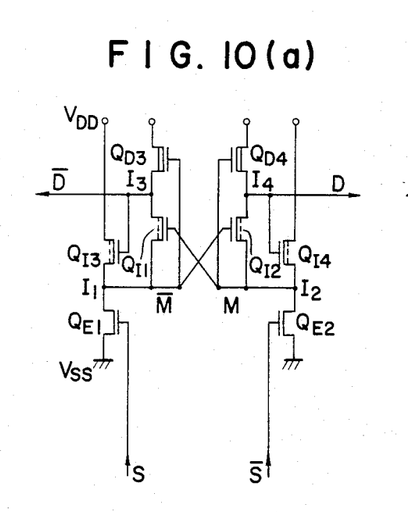
Figure 10B:
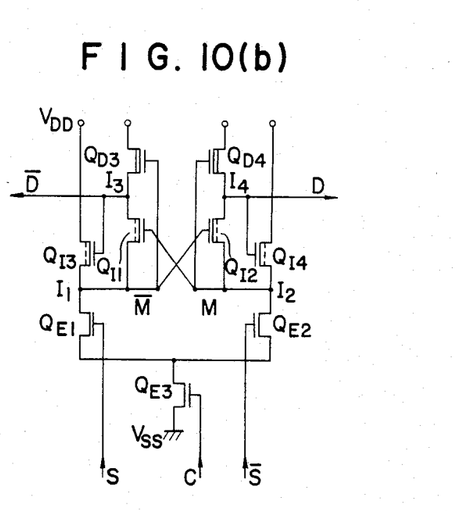
Figure 11A:
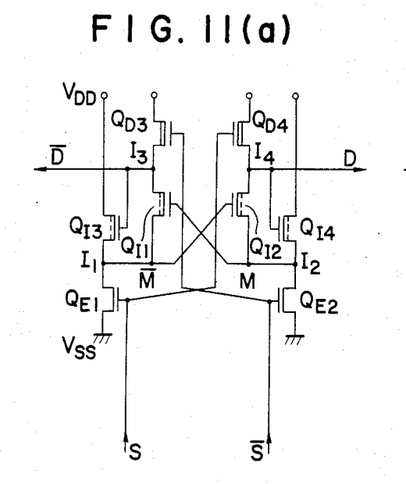
Figure 11B:
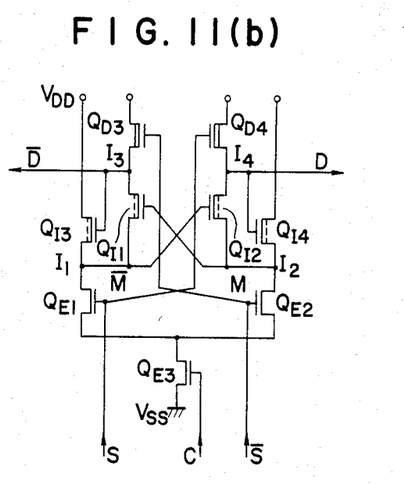

The circuits as shown in FIGS. 9(a), 10(a) and 11(a) correspond to those as shown in FIGS. 6(a), 7(a) and 8(a), respectively, and instead of the load transistors $Q_{D1}$ and $Q_{D2}$ of the inverters $I_1$ and $I_2$, intrinsic transistors $Q_{I3}$ and $Q_{I4}$ are used, of which absolute threshold voltage is lower than that of the transistors $Q_{D1}$ and $Q_{D2}$, and the outputs $\overline{D}$ and $D$ are applied to the gate terminals of the transistors $Q_{I3}$ and $Q_{I4}$, respectively. The feedback to the inverters $I_1$ and $I_2$ can be increased so that the amplification factor can be further increased.

Figure 12A:
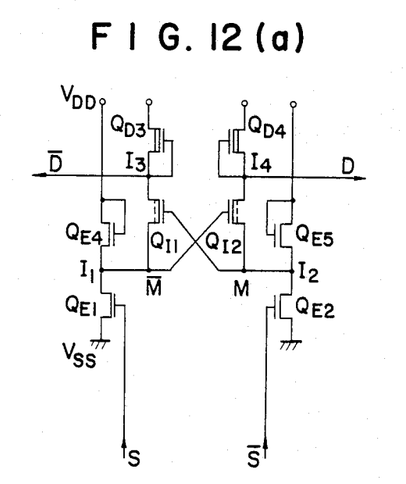
Figure 12B:
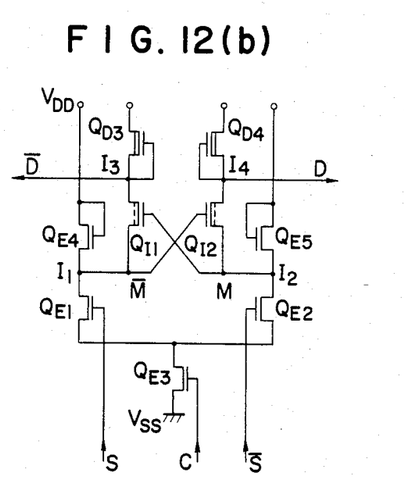
Figure 13A:
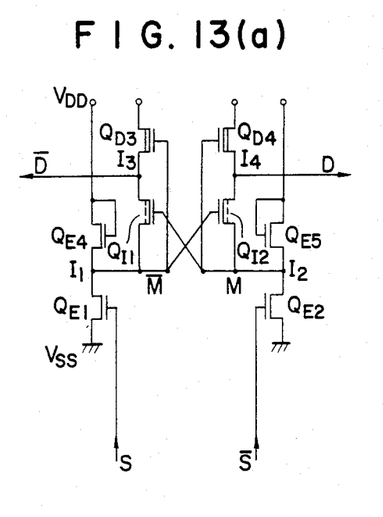
Figure 13B:
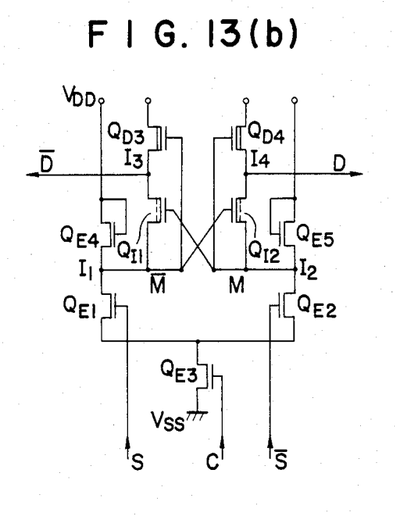
Figure 14A:
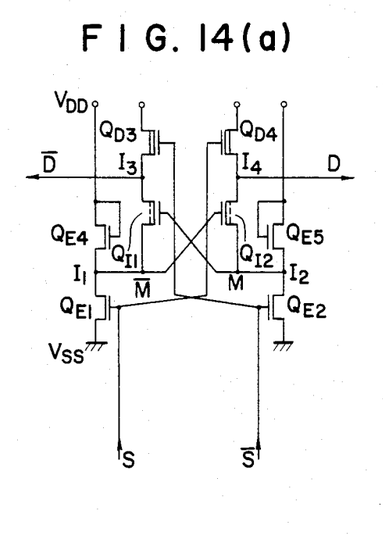
Figure 14B:
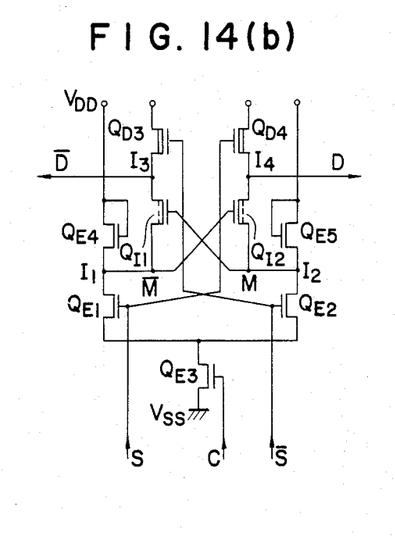

The circuits as shown in FIGS. 12(a), 13(a) and 14(a) correspond to those as shown in FIGS. 6(a), 7(a) and 8(a) and instead of the load transistors $Q_{D1}$ and $Q_{D2}$ of the inverters $I_1$ and $I_2$, enhancement type transistors $Q_{E4}$ and $Q_{E5}$ are used and the voltage $V_{DD}$ of the first reference voltage supply is applied to the gate terminals of the transistors $Q_{E4}$ and $Q_{E5}$. Therefore, the low level outputs, either $\overline{M}$ or $M$, of the inverters $I_1$ or $I_2$ may be more easily approached to the voltage $V_{ss}$ of the second reference voltage supply. Furthermore, the low level output voltage, either $D$ or $\overline{D}$ may be more easily approached to the voltage $V_{ss}$ and therefore the amplification factor can be further improved.

The circuits as shown in FIG. 3(b), 4(b), 5(b), 6(b), 7(b), 8(b), 9(b), 10(b), 11(b), 12(b), 13(b) and 14(b) correspond to those as shown in FIGS. 3(a), 4(a), 5(a), 6(a), 7(a), 8(a), 9(a), 10(a), 11(a), 12(a), 13(a) and 14(a), respectively, and, as in the case of the circuit as shown in FIG. 2(b), the control transistor $Q_{E3}$ is used so that each circuit becomes of the differential amplifier type and consequently the amplification factor can be further enhanced.

The transistors used in the present invention may vary in threshold voltage as far as Eq. (1') is satisfied. Especially, the threshold voltage of load transistors $Q_{D1}$ and $Q_{D2}$ may differ from that of load transistor $Q_{D3}$ and $Q_{D4}$. In like manner, the load transistors $Q_{I3}$ and $Q_{I4}$ and the driving transistors $Q_{I1}$ and $Q_{I2}$ may have the same or different threshold voltages. Furthermore, the load transistor $Q_{E3}$ and $Q_{E4}$ and the driving transistors $Q_{E1}$ and $Q_{E2}$ may have the same or different threshold voltages.

The amplification factors of the above-described embodiments and their modifications were measured. The threshold voltage $V_{TE}$ of the enhancement type transistors $Q_{E1}$, $Q_{E2}$, $Q_{E3}$, $Q_{E4}$ and $Q_{E5}$ used was between 0.4 and 1.2 V while the depletion type transistors $Q_{D1}$, $Q_{D2}$, $Q_{D3}$ and $Q_{D4}$ had the threshold voltage $V_{TD}$ between $-7$ V and $-3$ V. The threshold voltage $V_{TI}$ of the intrinsic transistors $Q_{I1}$, $Q_{I2}$, $Q_{I3}$ and $Q_{I4}$ was between $-0.3$ V and 0.3 V. The amplification factors were at least 1.3 times and at most 9.3 times as high as those of the conventional sense amplifier.

The enhancement type MOS transistors $Q_{E3}$ used in the differential amplifiers as shown from FIG. 2(b) to FIG. 14(b) may be controlled enabled or disabled in response to an external signal, therefore their threshold voltages are not needed to be equal to those of the transistors $Q_{E1}$ and $Q_{E2}$.

So far the present invention has been described in conjunction with MOS transistors, but it is to be understood that instead of the depletion type transistors $Q_{D1}$, $Q_{D2}$, $Q_{D3}$ and $Q_{D4}$ and/or intrinsic transistors $Q_{I1}$, $Q_{I2}$, $Q_{I3}$ and $Q_{I4}$, junction field-effect transistors may be employed.

So far the present invention has been described also in conjunction with n-channel MOS transistors, but it is to be understood that p-channel MOS transistors may be used. In the latter case, it is of course needed to reverse the polarities of the power supplies and threshold voltages.

In the above-described embodiments and their modifications, a suitable gate voltage may be applied to the gate of each load transistor in each inverter. To this end, various interconnection schemes may be considered but they are obvious to those skilled in the art in view of the above embodiments and their modifications.

As described above, according to the present invention, the output section or stage comprises for inverters so that the driving transistors of the output inverters may be easily disabled and consequently the output voltage may easily approach the voltage of one reference power supply. Thus a high amplification factor can be obtained.

What is claimed is:
1. A sense amplifier comprising:
 (a) a first inverter comprising a series circuit of a first transistor which is a driving transistor and which has a first input terminal and a second transistor which is a load transistor;
 (b) a second inverter comprising a series circuit of a third transistor which is a driving transistor and which has a second input terminal and a fourth transistor which is a load transistor;
 (c) a third inverter comprising a series circuit of a fifth transistor which is a driving transistor and to which is applied as an input the output of said second inverter and a sixth transistor which is a load transistor, the junction between said fifth and sixth transistor being a first output terminal;
 (d) a fourth inverter comprising a series circuit of a seventh transistor which is a driving transistor and to which is applied as an input the output of said first inverter and an eighth transistor which is a load transistor, the junction between said seventh and eighth transistor being a second output terminal;
 (e) each of said load transistors of said first through fourth inverters having a terminal connected to a first power supply means;
 (f) said first and third transistors in said first and second inverters having terminals connected to a second power supply means;
 (g) said fifth transistor in said third inverter having a terminal to which is applied as a power supply the output from said first inverter while said seventh transistor in said fourth inverter having a terminal to which is applied as a power supply the output from said second inverter;
 (h) said first and third transistors having a first threshold voltage, said second and fourth transistors having a second threshold voltage, said fifth and seventh transistors having a third threshold voltage, and said sixth and eighth transistors having a fourth threshold voltage; and
 external input signals being applied to said first and second input terminals whereby output signals are derived from said first and second output terminals.

2. A sense amplifier as set forth in claim 1 wherein:
 the absolute value of said third threshold voltage is less than or equal to the absolute voltage of said first threshold voltage,
 the absolute value of said fourth threshold voltage is greater than the absolute value of said first threshold voltage, and
 the absolute value of said second threshold voltage is less than or equal to the absolute value of said fourth threshold voltage.

3. A sense amplifier comprising:

(a) a first inverter comprising a series circuit of a first transistor which is a driving transistor and which has a first input terminal, and a second transistor which is a load transistor;
(b) a second inverter comprising a series circuit of a third transistor which is a driving transistor and which has a second input terminal and a fourth transistor which is a load transistor;
(c) a third inverter comprising a series circuit of a fifth transistor which is a driving transistor and to which is applied as an input the output of said second inverter and a sixth transistor which is a load transistor, the junction between said fifth and sixth transistor being a first output terminal;
(d) a fourth inverter comprising a series circuit of a seventh transistor which is a driving transistor and to which is applied as an input the output of said first inverter and an eighth transistor which is a load transistor, the junction between said seventh and eighth transistor being a second output terminal;
(e) each load transistor of each inverter having a terminal connected to a first power supply;
(f) said first and third transistors in said first and second inverters having a common terminal which is connected to a second power supply through a ninth transistor which responds to an external signal;
(g) said fifth transistor in said third inverter having a terminal to which is applied as a power supply the output from said first inverter while the seventh transistor in said fourth inverter having a terminal to which is applied as a power supply the output from said second inverter;
(h) said first and third transistors having a first threshold voltage, said second and fourth transistors having a second threshold voltage, said fifth and seventh transistors having a third threshold voltage, said sixth and eighth transistors having a fourth threshold voltage and said ninth transistor having a fifth threshold voltage; and external input signals being applied to said first and second input terminals whereby output signals are derived from said first and second output terminals.

4. A sense amplifier as set forth in claim 3 wherein the absolute value of said third threshold voltage is less than or equal to the absolute value of said first threshold voltage, the absolute value of said fourth threshold voltage being greater than the absolute value of said first threshold voltage and the absolute value of said second threshold voltage being less than or equal to the absolute value of said fourth threshold voltage.

5. A sense amplifier as set forth in claim 4 wherein the absolute value of said fifth threshold voltage is equal to the absolute value of said first threshold voltage.

* * * * *